United States Patent [19]

Rogers

[11] 4,141,712
[45] Feb. 27, 1979

[54] MANUFACTURING PROCESS FOR PACKAGE FOR ELECTRONIC DEVICES

[75] Inventor: Bryant C. Rogers, Escondido, Calif.

[73] Assignee: Diacon Inc., San Diego, Calif.

[21] Appl. No.: 816,598

[22] Filed: Jul. 18, 1977

[51] Int. Cl.² .................. C03B 23/20; C03C 27/02; B23P 17/00; H01B 19/00

[52] U.S. Cl. ........................... 65/36; 65/59 B; 65/42; 29/418; 29/630 B

[58] Field of Search .................. 65/59 B, 36, 42; 29/418, 630 B

[56] References Cited

U.S. PATENT DOCUMENTS

| | | | |
|---|---|---|---|
| 2,438,046 | 3/1948 | Giannuzzi et al. | 29/630 B X |
| 2,874,363 | 2/1959 | Ainsworth | 29/630 B |
| 3,325,586 | 6/1967 | Suddick | 65/36 X |
| 3,340,347 | 9/1967 | Spiegler | 65/36 X |
| 3,469,017 | 9/1969 | Starger | 65/59 B X |
| 3,482,419 | 12/1969 | Rogers et al. | 65/36 |
| 3,501,833 | 3/1970 | Spiegler | 65/59 B X |
| 3,524,249 | 8/1970 | Hamada et al. | 65/59 B X |
| 3,560,180 | 2/1971 | Merat | 65/59 B X |
| 4,055,888 | 11/1977 | Morrill, Jr. et al. | 65/59 B X |

Primary Examiner—Richard V. Fisher
Assistant Examiner—F. W. Miga
Attorney, Agent, or Firm—Ronald E. Grubman

[57] ABSTRACT

Semiconductor packages are manufactured according to a method which eliminates or greatly reduces the occurrence of short circuited or otherwise badly positioned leads. The method utilizes a leadframe having a bonding tip support connecting the bonding tips of the leads. After the leadframe is affixed to a ceramic element, the connecting element is removed.

6 Claims, 7 Drawing Figures

MANUFACTURING PROCESS FOR PACKAGE FOR ELECTRONIC DEVICES

BACKGROUND OF THE INVENTION

Many semiconductors packages, such as the now familiar dual in-line package (DIP), utilize a metallic leadframe forming a pattern of metal interconnections (leads) embedded in a glass surface on a ceramic base to which a semiconductor chip is attached. The leads provide electrical interconnections between the semiconductor chip and other electronic components. Typically, the innermost portion of each lead functions as a bonding tip to which connection is made by a fine metallic wire (usually gold or aluminum) which is itself bonded to the semiconductor chip. The leadframe configuration therefore includes a large number of bonding tips surrounding the semiconductor chip.

In the manufacture of packages with larger numbers of leads it has been a problem to maintain appropriate lead-to-lead spacing between the bonding tips. Maintaining coplanarity of the bonding tips has also been difficult. These problems probably arise from the release or formation of mechanical stresses built up within the metallic leads when the package is heated to embed the metallic leadframe in a glass layer on the surface of the base. Furthermore, the glass layer itself is not precisely uniform, causing relative displacements of the bonding tips. The resulting packages exhibit variations in the lead-to-lead capacitances, or even electrical short circuits between some of the leads. Additionally, the non-uniformity in spacing and/or co-planarity of the bonding tips makes automated bonding to the semiconductor chip unreliable. For all of these reasons the manufacture of packages with more than about 40 leads is extremely difficult with present technology.

SUMMARY OF THE INVENTION

In accordance with the illustrated preferred embodiments, the present invention provides apparatus and a method of manufacture for semiconductor packages which ensures that the bonding tips will be coplanar and precisely spaced apart. The process utilizes a leadframe according to the invention which includes a bonding tip support interconnecting some or all of the bonding tips. The leadframe is first affixed to a package support such as a base or a cap while the bonding tip support is in place. The bonding tip support is removed after the leads and bonding tips are fixedly attached to the package support.

In accordance with one preferred process, the leadframe is first affixed to a ceramic "window-frame" cap having an opening (window) adjacent the bonding tips. After the leadframe is affixed to the window-frame cap, the connection portion of the leadframe is removed. The bonding tips which were originally fixedly positioned relative to one another by means of the tip support remain fixedly positioned by virtue of their attachment to the window-frame cap. Finally, the leadframe and cap are affixed to a base on which a semiconductor element is to be mounted, forming a package in which the leads are sandwiched between the base and the cap.

In accordance with another preferred process the leadframe is embedded in a glass surface on a base, the bonding tips being partially exposed. In this embodiment the bonding tip supports are in the form of tabs which interconnect groups of bonding tips. The leadframe is embedded in the base with the tabs protruding to permit their being subsequently snapped off.

Both of the preferred processes using leadframes according to the invention ensure that the bonding tips are fixedly maintained in the desired spatial position during all steps of the manufacturing process.

DETAILED DESCRIPTION OF THE INVENTION

Figure 1:
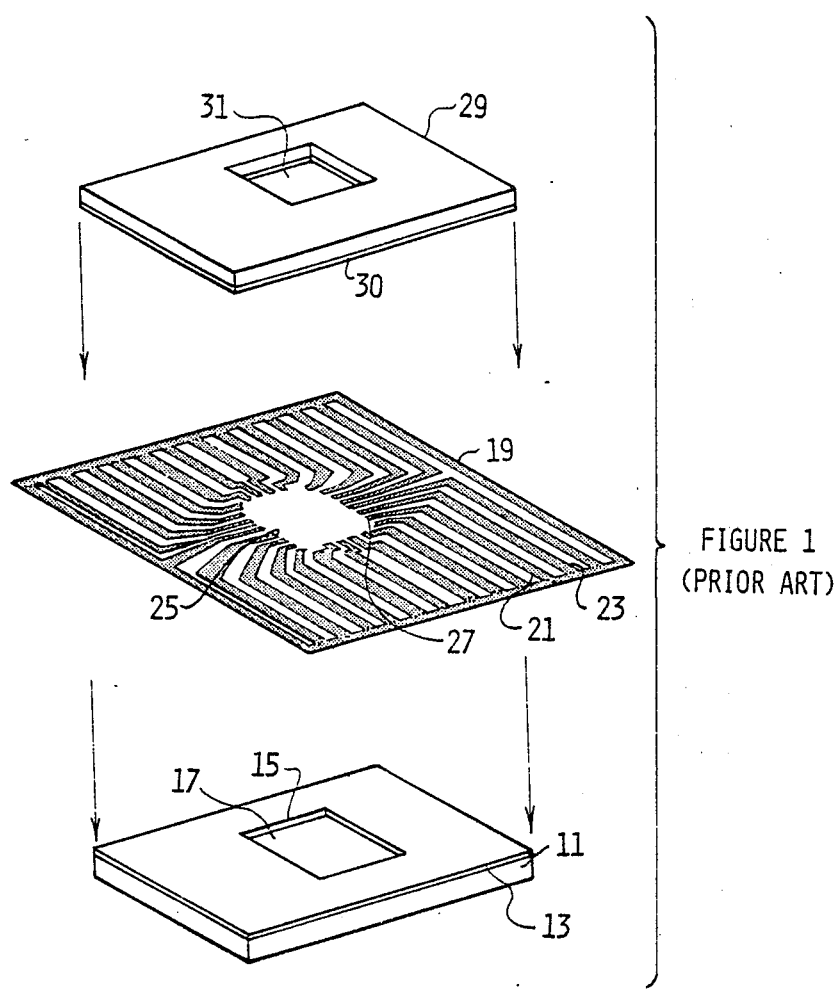
FIG. 1 shows an exploded view of a prior art package for an electronic component.

In FIG. 1 (prior art) there is shown a rectangularly shaped base 11, typically ceramic. The top surface of base 11 is glazed with a glass layer 13. An opening 15 in glass layer 13 exposes a portion 17 of the substrate on which a semiconductor device may be mounted. A metallic leadframe 19 forming a pattern of electrical leads (exemplary ones of which are labeled 21 and 23) is brought into intimate contact with base 11. Leadframe 19 is then embedded in glass surface 13 by methods known in the art; for example base 11 with leadframe 19 positioned on glass surface 13 may be transported into a furnace. To complete the fabrication of the prior art package, leadframe 19 is sandwiched between base 11 and a window-frame cap 29, which is affixed to base 11, e.g. by heating of a glazed glass layer 30 on the bottom of cap 29. Cap 29 is typically of ceramic and includes an opening 31 extending completely through the thickness of the cap to provide a window through which a semiconductor chip may be mounted on portion 17 of base 11. After the semiconductor element has been affixed to base 11, electrical connections are made from the semiconductor to one end of each lead. These lead tips will be referred to hereafter as "bonding tips", the tips corresponding to leads 21 and 23 being labeled 25 and 27, respectively.

Figure 2:
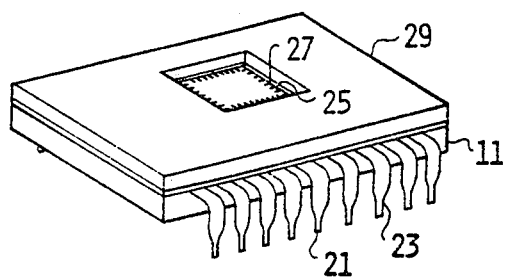
FIG. 2 illustrates a package preparatory to placement of electronic component therein.

FIG. 2 shows a package awaiting placement oof a semiconductor chip; leadframe 19 has been bent perpendicular to the surface of base 11 to exhibit the well known DIP structure.

The above-described process suffers from the problems described earlier, and in particular does not suffice to reliably produce packages having larger numbers of leads. Difficulties arise because bonding tips 25, 27, etc. will often undergo both lateral movement and displacements out of the plane of leadframe 19 when the leadframe and base are subjected to high temperatures. Since the lead-to-lead spacing may be as little as 0.01", even a 0.001" displacement of each of a pair of adjacent leads (typically also about 0.01" in width) can produce a 20% variation in lead-to-lead capacitance. Out-of-plane displacements of only 0.001"–0.002" can seriously interfere with high-reliability automatic bonding.

Figure 3A:
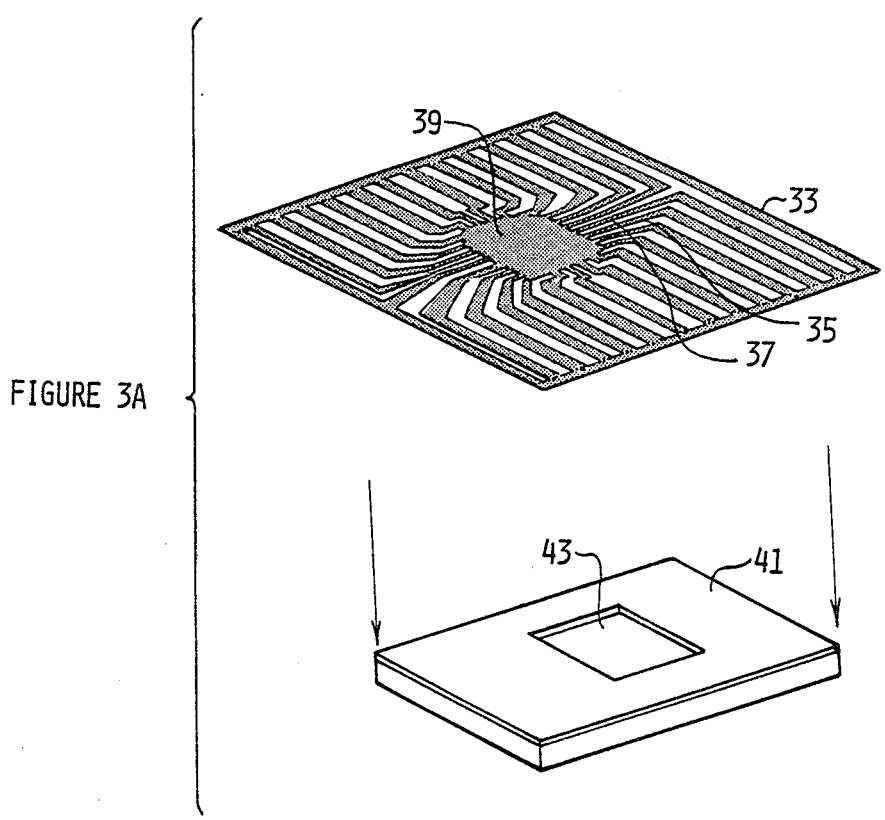
FIG. 3A shows a leadframe and window-frame cap according to the invention.
Figure 4A:
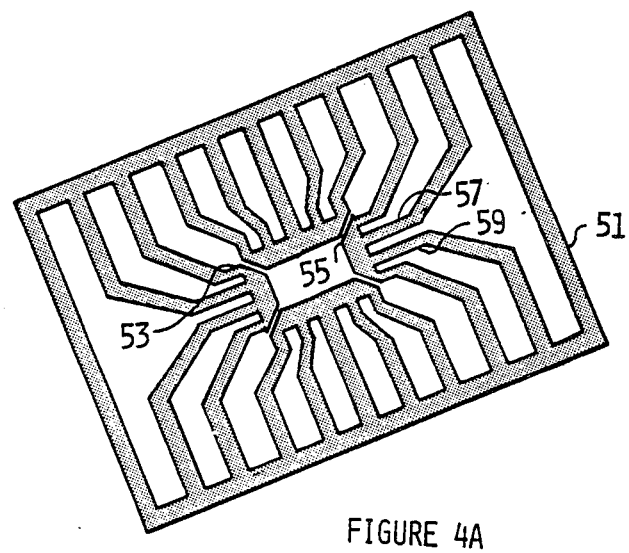
FIG. 4A illustrates an alternate embodiment of a lead frame according to the invention.

These difficulties are eliminated or greatly reduced in a manufacturing process according to the present invention. The process utilizes a new type of leadframe 33, shown in FIG. 3A. Leadframe 33 is similar to leadframe 19 described above, but includes the novel feature that the bonding tips (two of which are labeled 35 and 37) are attached to a central bonding tip support 39. This structure ensures that the bonding tips will not be subject to any relative movement so long as tip support 39 is not removed. Leadframe 33 including tip support 39 can be manufactured by any suitable technique known in the art such as by stamping or chemical milling (etching). In present devices are typically from 24 to about 48 leads having bonding tips about 0.01" in width spaced around a central area about 0.25 in.$^2$. Tip support 39 may be in the form of a solid area as shown in FIG. 3A, or may have other shapes, such as a ring-like configuration connecting the bonding tips. Notice that while the presently preferred embodiment has all bonding tips attached to tip support 39, it would also be possible to leave certain ones detached; the principles of the invention will then apply to those bonding tips which are mutually attached; this will be discussed further in connection with the embodiment of FIGS. 4A and 4B. Leadframe 33 will be attached to a package support to form a package framework. In FIG. 3A the package support is shown as a window-frame cap 41, including a window 43 extending through the thickness of cap 41.

Figure 3B:
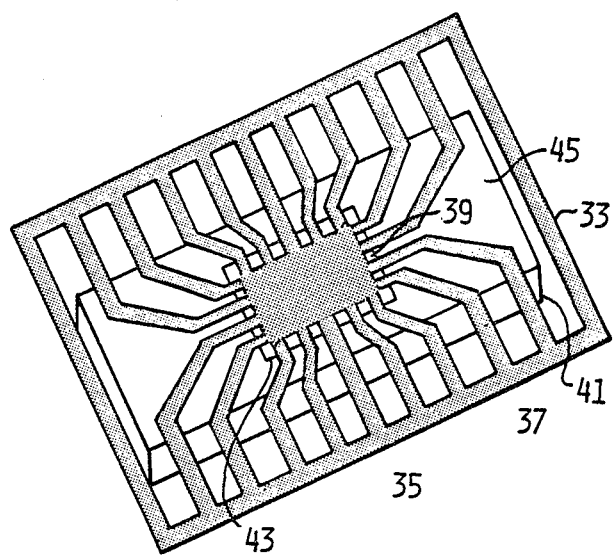
FIG. 3B shows a package framework in which the leadframe of FIG. 3A is attached to the window-frame.

FIG. 3B shows leadframe 33 affixed to cap 41 as the first step in the preferred manufacturing process. This may be accomplished e.g. by glazing a surface 45 of window-frame 41 with a glass substance whose temperature coefficient of expansion closely matches that of metallic leadframe 33. Window-frame 41 and leadframe 33 are then brought into contact and heated to a temperature of about 450° C. to melt the glass. An alternative technique is the sealing method disclosed and claimed in U.S. Pat. No. 3,768,991 assigned to the present assignee. During the above-described steps leading to attachment of leadframe 33 to window-frame 41, tip support 39 of leadframe 33 remains in place to prevent any relative motion of bonding tips 35, 37, etc. which are thereby maintained in a precise spatial position relative to one another during these processing steps.

Figure 3C:
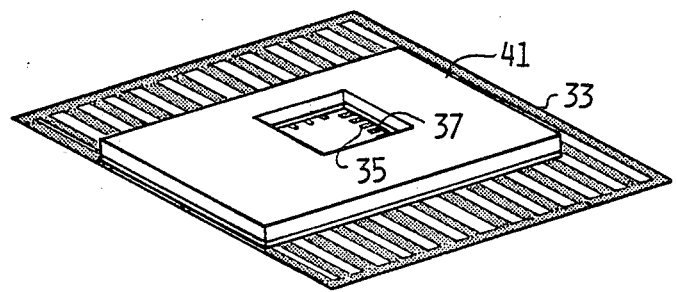
FIG. 3C shows the leadframe and window-frame prior to attachment to a substrate.
Figure 3C:
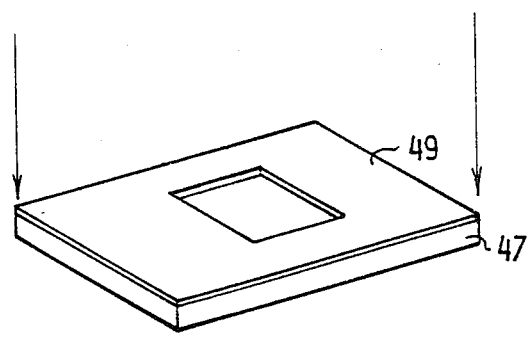

The next step in the fabrication is to remove tip support 39. For example, a conventional metal punch can operate through window 43 to punch out support 39. Alternately, portion 39 can be scored to facilitate removal. In FIG. 3C a composite structure consisting of leadframe 33 attached to window-frame 45 has been inverted and is brought into contact with a base 47, typically ceramic. As described above in connection with FIG. 1, a surface 49 of base 47 may be glazed with a glass which is subsequently heated to make permanent contact with leadframe 33 and cap 41. At this step in the fabrication, tip support 39 has already been removed from leadframe 33 so that bonding tips 35, 37, etc. are no longer mutually connected. However, mispositioning of the bonding tips is still precluded, since the leads have already been rigidly attached to window-frame 41 prior to this last heating step. Thus, the package has been fabricated according to the invention in a manner which eliminates or greatly reduces the possibility of short-circuited or otherwise badly positioned bonding tips.

Figure 4B:
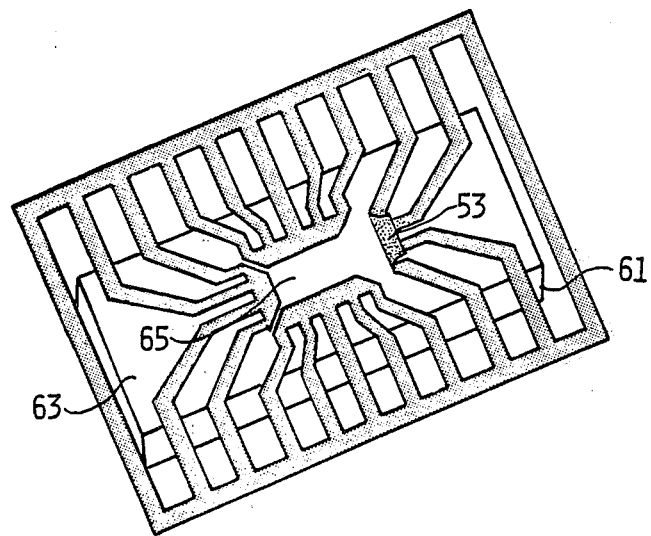
FIG. 4B shows the lead frame of FIG. 4A attached to a substrate.

The principles of the invention also apply to packages in which a solid cap is utilized instead of the window-frame cap heretofore discussed. In such packages the leadframe is typically first affixed to a ceramic base. The semiconductor element is then attached to the base and electrical connections made to the bonding tips. Finally a pre-glassed solid cap is placed over the entire device. Although it is more difficult to obtain hermetic seals in these devices, they may be less costly to manufacture and are presently used for certain applications. Since there is no window in the cap of such packages, it is not possible to simply punch out the central connecting portion of the leadframe as was described above in connection with FIG. 3B. However, the principles of the invention may be applied as in FIG. 4 in which leadframe 51 is illustrated in which the central portion of the leadframe includes four scored "tabs", one of which is labeled 53. These tabs interconnect the bonding tips within different groups. For example, bonding tips 55, 57 and 59 are connected by tab 53. Leadframe 51 is again embedded in a package support to form a package framework. In this embodiment the package support is a base 61 having a glass layer 63 on its surface to form a package support to which a solid cap (not shown) may be attached. Glass layer 63 includes an opening 65 giving access to a portion of the substrate to which a semiconductor chip will be attached. Tabs 53 etc. extend from glass layer 63 into opening 65, and may be bent back and snapped off as indicated in FIG. 4B after the leads have been embedded in glass layer 63. Relative motion of the bonding tips is therefore minimized during the manufacturing process.

I claim:

1. A method for manufacturing a framework for a package for an electronic component comprising the steps of:

attaching to a package support a leadframe having a plurality of leads extending inwardly from a frame, the inwardmost portion of each lead terminating in a bonding tip, at least some of said bonding tips being interconnected by a bonding tip support which prevents relative motion among the interconnected bonding tips during the attaching step; and then removing said bonding tip support to yield said framework for said package.

2. A method as in claim 1 wherein:

said package support comprises a window-frame cap having an opening disposed about said bonding tip support; and said bonding tip support is removed by punching through said opening.

3. A method for manufacturing a package for an electronic component comprising the method of manufacturing a framework as in claim 2, and further including the step of attaching said framework to a package base configured for mounting of said electronic component.

4. A method as in claim 1 wherein said package support comprises a package base configured for mounting of said electronic component.

5. A method as in claim 4 wherein:

said bonding tip support comprises at least one tab interconnecting at least some of said bonding tips; and said bonding tip support is removed by snapping off said tabs to yield said framework for said package.

6. A method as in claim 2 wherein the attaching step comprises the steps of:

glazing a surface of said window-frame cap with a material having a temperature coefficient of expansion closely matching that of said window-frame cap;

bringing said leadframe into intimate contact with said surface of said window-frame cap; and heating said leadframe and said window-frame cap to a temperature sufficient to melt said material.

* * * * *